(12) United States Patent
Cole et al.

(10) Patent No.: US 7,881,064 B2
(45) Date of Patent: Feb. 1, 2011

(54) FLEXIBLE PADDLE CARD FOR INSTALLATION ON A MOTHERBOARD OF A COMPUTING SYSTEM

(75) Inventors: Dennis F. Cole, Cary, NC (US); Thomas D. Pahel, Jr., Raleigh, NC (US); Challis L. Purrington, Raleigh, NC (US); Sean P. Ryan, Wake Forest, NC (US); Jack P. Wong, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 492 days.

(21) Appl. No.: 12/053,724

(22) Filed: Mar. 24, 2008

(65) Prior Publication Data

US 2009/0237895 A1 Sep. 24, 2009

(51) Int. Cl.
*H05K 1/14* (2006.01)
(52) U.S. Cl. .................................. 361/749; 174/254
(58) Field of Classification Search ................ 361/749, 361/760, 767; 174/254; 710/305; 29/830
See application file for complete search history.

(56) References Cited

U.S. PATENT DOCUMENTS

| | | | | |
|---|---|---|---|---|
| 4,812,135 A * | 3/1989 | Smith | .......................... | 439/493 |
| 5,008,496 A * | 4/1991 | Schmidt et al. | ............. | 174/254 |
| 5,121,297 A * | 6/1992 | Haas | .......................... | 361/751 |
| 5,144,742 A * | 9/1992 | Lucas et al. | .................... | 29/830 |
| 5,523,695 A * | 6/1996 | Lin | ............................. | 324/755 |
| 5,742,480 A | 4/1998 | Sawada et al. | | |
| 6,084,778 A * | 7/2000 | Malhi | .......................... | 361/749 |
| 6,172,881 B1 * | 1/2001 | Hirai | .......................... | 361/816 |
| 6,288,343 B1 * | 9/2001 | Ahn et al. | ..................... | 174/254 |
| 6,328,598 B1 * | 12/2001 | Harris, Jr. | ................... | 439/516 |
| 6,594,152 B2 * | 7/2003 | Dent | .......................... | 361/785 |
| 6,617,519 B2 * | 9/2003 | Wakimoto et al. | .......... | 174/254 |
| 6,717,556 B2 * | 4/2004 | Asahi et al. | ................... | 345/1.1 |
| 7,256,345 B2 | 8/2007 | Inoue | | |
| 7,292,448 B2 * | 11/2007 | Urushibara et al. | ......... | 361/748 |
| 2002/0050399 A1 | 5/2002 | Yang et al. | | |
| 2007/0089900 A1 | 4/2007 | Mitamura et al. | | |
| 2007/0202307 A1 | 8/2007 | Oh et al. | | |

* cited by examiner

*Primary Examiner*—Dameon E Levi
(74) *Attorney, Agent, or Firm*—Edward J. Lenart; Cynthia G. Seal; Biggers & Ohanian, LLP

(57) ABSTRACT

Flexible paddle cards for installation on a motherboard of a computing system are disclosed that are oriented parallel with the motherboard when installed in the computing system and include: a printed circuit board; and three card connectors that correspond to three motherboard connectors mounted on the motherboard, two of the card connectors mounted on a first rigid region of the printed circuit board, the remaining third card connector mounted on a second rigid region of the printed circuit board, and the first rigid region and the second rigid region separated by a flexible region of the printed circuit board, the flexible region having a width that allows the printed circuit board to flex when the card connectors mate with the motherboard connectors.

19 Claims, 4 Drawing Sheets

PRIOR ART

FLEXIBLE PADDLE CARD FOR INSTALLATION ON A MOTHERBOARD OF A COMPUTING SYSTEM

BACKGROUND OF THE INVENTION

1. Field of the Invention

The field of the invention is data processing, or, more specifically, flexible paddle cards for installation on a motherboard of a computing system, methods for enhancing an existing paddle card to prevent damage when the paddle card is installed on a motherboard of a computing system, and methods for manufacturing a flexible paddle card for installation on a motherboard of a computing system.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

As these powerful computing systems have become more and more complex, the system architectures have evolved such that essential components of the computing system, such as the processor and main memory, are configured on a motherboard, while other specialized functions, such as those for networking and storage, are often configured on modular daughter cards that plug into the motherboard. In such a manner, the daughter cards are used to extend the functionality of the computing system to satisfy the demands of a particular computing environment.

A paddle card is a specialized type of daughter card that receives signals from a motherboard and re-drives the signals for transmission to other computing components not installed on the motherboard. The types of signals processed by a paddle card depend on the type of paddle card installed on the motherboard. For example, a paddle card may be implemented as an Ethernet™ paddle card that processes Ethernet signals, a Serial Attached Small Computer System Interface ('SCSI') paddle card that processes SCSI signals, a Fibre Channel paddle card that processes Fibre signals, and so on.

The manner in which a paddle card seats on a motherboard may vary from one system architecture to another. Some paddle cards may be installed in the motherboard such the paddle card is perpendicular to the motherboard. Other paddle cards may be installed in the motherboard such the paddle card is parallel with the motherboard. The manner in which the paddle cards mate with the motherboard may depend on the physical configuration of the computing system, the form factor of the components installed in the computing system, the configuration of the connectors on the paddle card, and so on.

Paddle cards come in a variety of connector configurations. Many paddle cards are implemented with two connectors—one connector for receiving data and control signals from the motherboard and another connector to which a cable is attached and through which the paddle card transmits the signals to another computing component. Such paddle cards may be used when external components connect to the motherboard through physical cables because one connector may be seated on the motherboard while the other connector may mate with the cable.

In other systems, however, such as for example a blade server system, each blade server motherboard connects to other external components, such as for example, switches or network storage devices, through a mid-plane as opposed to physical cables. Each motherboard plugs directly into the mid-plane and all signals received by or originating from the motherboard pass through the mid-plane. As such, signals processed by paddle cards installed on the motherboard must be routed back through the motherboard before the signal may be transmitted to an external component through the mid-plane. In such systems, paddle cards may be implemented with three connectors—a first connector for receiving data signals from the motherboard, a second connector for providing the processed data signals back to the motherboard for transmission through the mid-plane, and a third connector for providing power and control signals to the paddle board.

For example, consider FIG. 1A that sets forth a line drawing that illustrates an existing paddle card (104) having three card connectors (106). The three connectors (106) of the existing paddle card (104) correspond with three connectors (102) on the motherboard (100). When the three card connectors (106) mate with the motherboard connectors (102), the existing paddle card (104) will seat on the motherboard (100) in parallel with the motherboard (100). There is, however, a drawback to existing paddle cards that have three connectors. Due to manufacturing variabilities, the card connectors (106) may not align precisely with the corresponding motherboard connectors (102). For example, consider FIG. 1B that sets forth a line drawing that illustrates misalignment between card connectors (106) of an existing paddle card (104) and motherboard connectors (102) of a motherboard (100). The motherboard (100) and the motherboard connectors (102) are represented in FIG. 1B using solid line rectangles. The center of each motherboard connector (102) for alignment purposes is represented using a solid circle. The existing paddle card (104) is represented using a dashed line rectangle, and the card connectors (106) are represented using dotted line rectangles. The center of each card connector (106) for alignment purposes is represented using a dotted circle. From the illustration of FIG. 1B, readers will note that when the bottom card connector mates with the corresponding motherboard connector, the two pair of connectors above it are out of alignment due to the manufacturing variabilities. When the card connectors (106) are out of alignment with the corresponding motherboard connectors (102), often damage occurs to either the motherboard (100) or the paddle card (104) when a computer technician attempts to seat the paddle card (104) into the motherboard (100).

SUMMARY OF THE INVENTION

Flexible paddle cards for installation on a motherboard of a computing system are disclosed that are oriented parallel with the motherboard when installed in the computing system and include: a printed circuit board; and three card connectors that correspond to three motherboard connectors mounted on the motherboard, two of the card connectors mounted on a first rigid region of the printed circuit board, the remaining third card connector mounted on a second rigid region of the printed circuit board, and the first rigid region and the second rigid region separated by a flexible region of the printed circuit board, the flexible region having a width that allows the printed circuit board to flex when the card connectors mate with the motherboard connectors.

Methods for enhancing an existing paddle card to prevent damage when the paddle card is installed on a motherboard of a computing system are disclosed that include: providing a paddle card, the paddle card including a printed circuit board, three card connectors mounted on the printed circuit board that correspond to three motherboard connectors mounted on the motherboard of the computing system; identifying a first rigid region for the printed circuit board on which two of the card connectors are mounted; identifying a second rigid region for the printed circuit board on which the remaining third card connector is mounted; and creating a flexible region for the printed circuit board between the first rigid region and the second rigid region, the flexible region having a width that allows the paddle card to flex when the card connectors mate with the corresponding motherboard connectors.

Methods for manufacturing a flexible paddle card for installation on a motherboard of a computing system are disclosed that are oriented parallel with the motherboard when installed in the computing system and include: providing a printed circuit board; mounting three card connectors on the printed circuit board, the three card connectors corresponding to three motherboard connectors mounted on the motherboard of the computing system, two of the card connectors mounted on a first rigid region of the printed circuit board, the remaining third card connector mounted on a second rigid region of the printed circuit board; and creating a flexible region for the printed circuit board between the first rigid region and the second rigid region, the flexible region having a width that allows the paddle card to flex when the card connectors mate with the corresponding motherboard connectors.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1A:
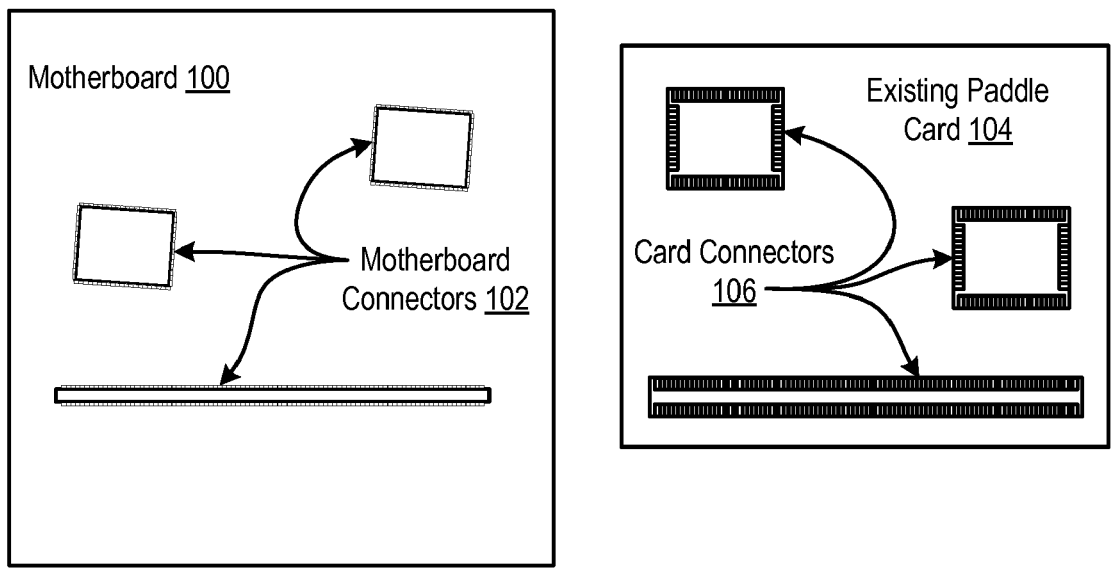
FIG. 1A sets forth a line drawing that illustrates an existing paddle card having three card connectors.
Figure 1B:
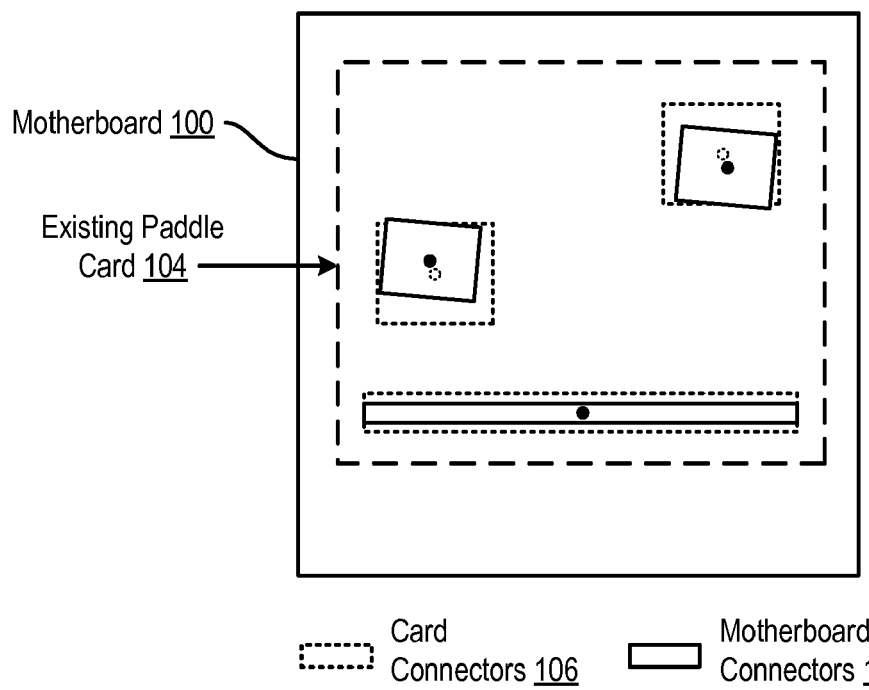
FIG. 1B sets forth a line drawing that illustrates misalignment between card connectors of an existing paddle card and motherboard connectors of a motherboard.
Figure 2A:
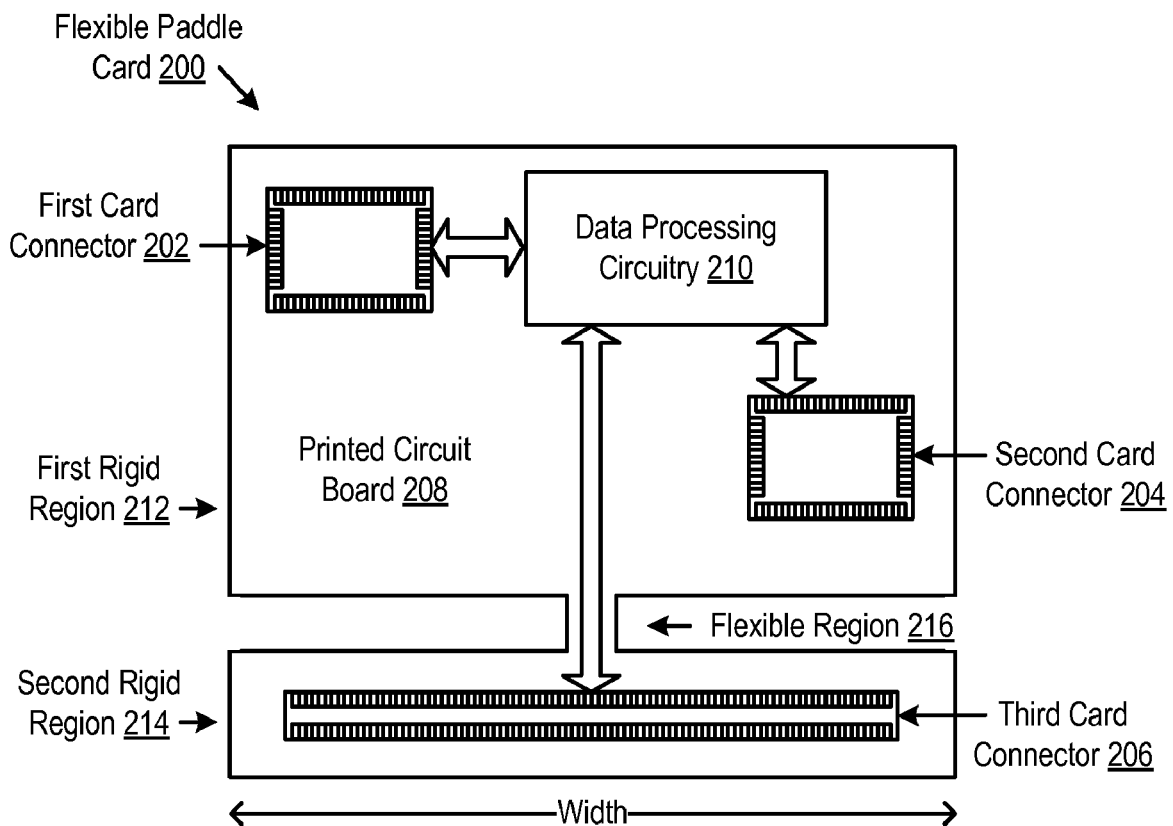
FIG. 2A sets forth a line drawing that illustrates an exemplary flexible paddle card for installation on a motherboard of a computing system according to embodiments of the present invention.

Exemplary flexible paddle cards for installation on a motherboard of a computing system, methods for enhancing an existing paddle card to prevent damage when the paddle card is installed on a motherboard of a computing system, and methods for manufacturing a flexible paddle card for installation on a motherboard of a computing system in accordance with the present invention are described with reference to the accompanying drawings, beginning with FIG. 2A. FIG. 2A sets forth a line drawing that illustrates an exemplary flexible paddle card (200) for installation on a motherboard of a computing system according to embodiments of the present invention. When installed in the computing system, the flexible paddle card (200) is oriented parallel with the motherboard.

The flexible paddle card (200) of FIG. 2A includes a printed circuit board ('PCB') (208). A PCB is a composite component that mechanically supports and electrically connects a plurality of electronic components using conductive pathways, or traces. The conductive pathways may be etched from conductive sheets laminated onto a non-conductive substrate or configured directly on a layer of substrate. A PCB may include any number of substrate layers on which conductive pathways are etched. The conductive sheet materials used to form the conductive pathways may be implemented using copper, aluminum, gold, or any other conductor as will occur to those of skill in the art.

In the example of FIG. 2A, the flexible paddle card (200) includes three card connectors (202, 204, 206) that correspond to three motherboard connectors mounted on the motherboard. Two of the card connectors (202, 204) are mounted on a first rigid region (212) of the printed circuit board (208). Each of the two card connectors (202, 204) mounted on the first rigid region (212) includes high-speed differential data signal pins for passing high-speed differential data signals between the flexible paddle card (200) and the motherboard. The high-speed differential data signals may be implemented as Serial Attached SCSI signals, Fibre channel signals, Peripheral Component Interconnect Express ('PCIe') signals, or any other high-speed differential data signals as will occur to those of skill in the art.

The remaining third card connector (206) is mounted on a second rigid region (214) of the printed circuit board (208). In the example of FIG. 2A, the remaining third card connector (206) mounted on the second rigid region (214) includes control signal pins and power signal pins that provide control signals and power to the flexible paddle card (200). The power signals may be used to provide power to the electronic components on the flexible paddle card (200), and the control signals may be used by a baseboard management controller ('BMC') on the motherboard to administer the flexible paddle card (200). The control signals may be implemented as Inter-Integrated Circuit ('I²C') signals, System Management Bus ('SMBus') signals, Intelligent Platform Management Interface ('IPMI') signals, Joint Test Action Group ('JTAG') signals, and so on. The remaining third card connector (206) may also include data signal pins that pass data signals between the flexible paddle card (200) and the motherboard. Such data signals may be implemented as Peripheral Component Interconnect ('PCI') signals, PCI-Extended ('PCIX') signals, PCIe signals, JTAG signals, or any other data signals as will occur to those of skill in the art.

In the example of FIG. 2A, the first rigid region (212) and the second rigid region (214) are separated by a flexible region (216) of the printed circuit board (208). The flexible region (216) has a width that allows the printed circuit board (208) to flex when the card connectors (202, 204, 206) mate with motherboard connectors on the motherboard. The width of the flexible region (216) is small enough to be flexible, but not so small as to be fragile and break during normal use and wear. Also, the width of flexible region must support conductive pathways between the components mounted in the first rigid region (212) and the components mounted in the second rigid region (214). While the flexible region (216) of FIG. 2A derives its flexibility from the thin width of the portion of the printed circuit board (208) composing the flexible region (216), the rigid regions (212, 214) typically derives their rigidity from the large width of the printed circuit board (208) in those regions. Exemplary form factors that may be improved for use with flexible paddle cards according to embodiments of the present invention may include the 'CFFv' form factor, the 'CFFh' form factor, the 'CIOv' form factor, and any other form factors as will occur to those of ordinary skill in the art.

The flexible paddle card (200) of FIG. 2A also includes data processing circuitry (210) operatively coupled to the two card connectors (202, 204) mounted on the first rigid region (212) of the printed circuit board (208) and operatively coupled to the remaining third card connector (206) in the second flexible region (214). The data processing circuitry (210) of FIG. 2A receives high-speed data signals from the motherboard through the first card connector (202) and re-drives the high-speed data signals to the motherboard through the second card connector (204). The data processing circuitry (210) of FIG. 2A receives power and control signals from the motherboard through the third card connector (206). The data processing circuitry (210) may be implemented as circuitry for processing Serial Attached SCSI signals, Fibre channel signals, PCI signals, PCIX signals, PCIe signals, and any other data signals as will occur to those of skill in the art.

Figure 2B:
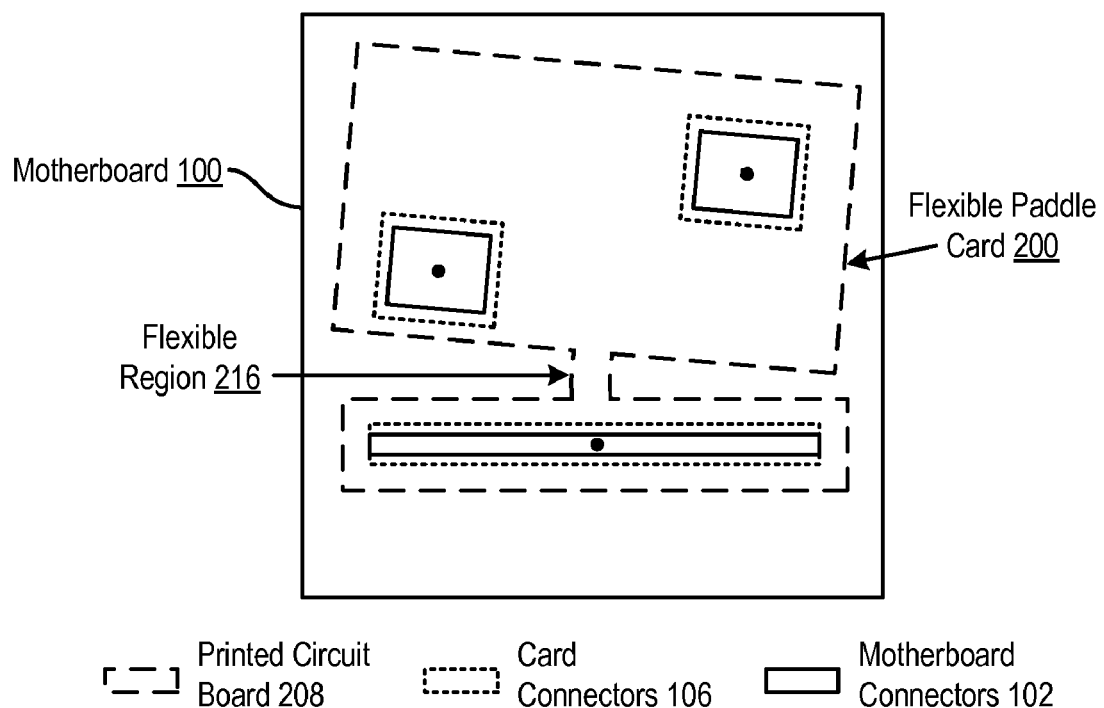
FIG. 2B sets forth a line drawing that illustrates an exemplary flexible paddle card according to embodiments of the present invention flexing to prevent damage to the flexible paddle card and to a motherboard when card connectors of the flexible paddle card mate with corresponding motherboard connectors of the motherboard.

For further explanation, FIG. 2B sets forth a line drawing that illustrates an exemplary flexible paddle card (200) according to embodiments of the present invention flexing to prevent damage to the flexible paddle card (200) and to a motherboard (100) when card connectors (106) of the flexible paddle card (200) mate with corresponding motherboard connectors (102) of the motherboard (100). The flexible paddle card (200) includes a printed circuit board (208) that is represented in FIG. 2B using a dashed line rectangle. The flexible paddle card (200) includes three card connectors (106) represented in FIG. 2B using dotted line rectangles. The three card connectors (106) mate with three corresponding motherboard connectors (102) mounted on a motherboard (100). The motherboard connectors (102) are represented in FIG. 2B using solid line rectangles. The flexible paddle card (200) of FIG. 2B includes a flexible region (216) that flexes to prevent damage to the flexible paddle card (200) and to the motherboard (100) when the card connectors (106) mate with the corresponding motherboard connectors (102).

As mentioned above, methods for enhancing an existing paddle card to prevent damage when the paddle card is installed on a motherboard of a computing system in accordance with the present invention are described with reference to the accompanying drawings. For further explanation, FIG. 3 sets forth a flow chart illustrating an exemplary method of enhancing an existing paddle card to prevent damage when the paddle card is installed on a motherboard of a computing system according to embodiments of the present invention. The method of FIG. 3 includes providing (300) a paddle card (301). The paddle card (301) of FIG. 3 includes a printed circuit board (208) and three card connectors (202, 204, 206) mounted on the printed circuit board (208). The three card connectors (202, 204, 206) correspond to three motherboard connectors mounted on the motherboard of the computing system.

Figure 3:
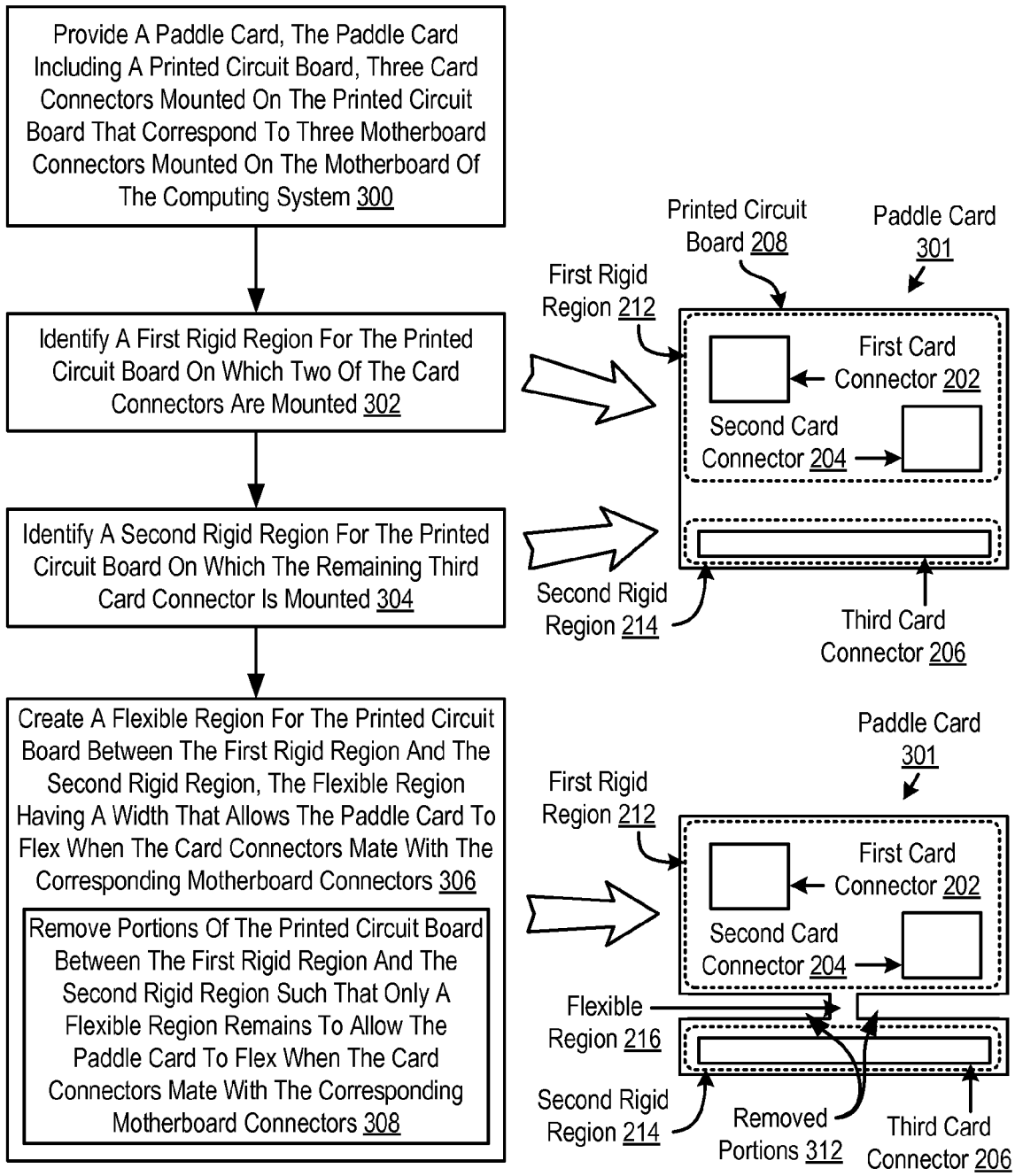
FIG. 3 sets forth a flow chart illustrating an exemplary method of enhancing an existing paddle card to prevent damage when the paddle card is installed on a motherboard of a computing system according to embodiments of the present invention.

The method of FIG. 3 includes identifying (302) a first rigid region (212) for the printed circuit board (208) on which two of the card connectors (202, 204) are mounted. Identifying (302) a first rigid region (212) for the printed circuit board (208) on which two of the card connectors (202, 204) are mounted according to the method of FIG. 3 may be carried out by identifying the first rigid region (212) based on the type of connectors mounted on the printed circuit board (208), the location of the connectors, the location of the conductive pathways on the printed circuit board, and so on. Each of the two card connectors (202, 204) mounted on the first rigid region (212) of the printed circuit board (208) may include high-speed differential data signal pins. As mentioned above, the high-speed differential data signal pins may used to pass high-speed differential data signals between the paddle card (301) and the motherboard.

The method of FIG. 3 also includes identifying (304) a second rigid region (214) for the printed circuit board (208) on which the remaining third card connector (206) is mounted. Identifying (304) a second rigid region (214) for the printed circuit board (208) on which the remaining third card connector (206) is mounted according to the method of FIG. 3 may be carried out by identifying the second rigid region (214) based on the type of connectors mounted on the printed circuit board (208), the location of the connectors, the location of the conductive pathways on the printed circuit board, and so on. The remaining third card connector (206) mounted on the second rigid region (214) of the printed circuit board (208) may include control signal pins and power signal pins for providing control signals and power, respectively to the paddle board (301) from the motherboard.

The method of FIG. 3 also includes creating (306) a flexible region (216) for the printed circuit board (208) between the first rigid region (212) and the second rigid region (214). The flexible region (216) of FIG. 3 has a width that allows the paddle card (301) to flex when the card connectors (202, 204, 206) mate with the corresponding motherboard connectors. Creating (306) a flexible region (216) for the printed circuit board (208) between the first rigid region (212) and the second rigid region (214) according to the method of FIG. 3 includes removing (308) portions (312) of the printed circuit board (208) between the first rigid region (212) and the second rigid region (214) such that only a flexible region (216) remains to allow the paddle card (301) to flex when the card connectors (202, 204, 206) mate with the corresponding motherboard connectors.

Although not shown, the paddle card (301) of FIG. 3 includes data processing circuitry operatively coupled to the two card connectors (202, 204) mounted on the first rigid region (212) of the printed circuit board (208). The data processing circuitry receives high-speed data signals from the motherboard through the first card connector (202) and re-driving the high-speed data signals to the motherboard through the second card connector (204). Readers will note that the high-speed differential data connectors through which the high-speed differential data signals are received are segmented in the same region (212) of the printed circuit board (208). Segmenting the printed circuit board such that the two high-speed differential connectors are in the same region (212) is advantageous because typically more traces exist between the high-speed differential data signal connectors and the data processing circuitry.

As mentioned above, methods for manufacturing a flexible paddle card for installation on a motherboard of a computing system in accordance with the present invention are described with reference to the accompanying drawings. For further explanation, FIG. 4 sets forth a flow chart illustrating an exemplary method of manufacturing a flexible paddle card (200) for installation on a motherboard of a computing system according to embodiments of the present invention. When installed in a computing system, the flexible paddle card (200) is oriented parallel with the motherboard when installed in the computing system. The method of FIG. 4 includes providing (400) a printed circuit board (208).

Figure 4:
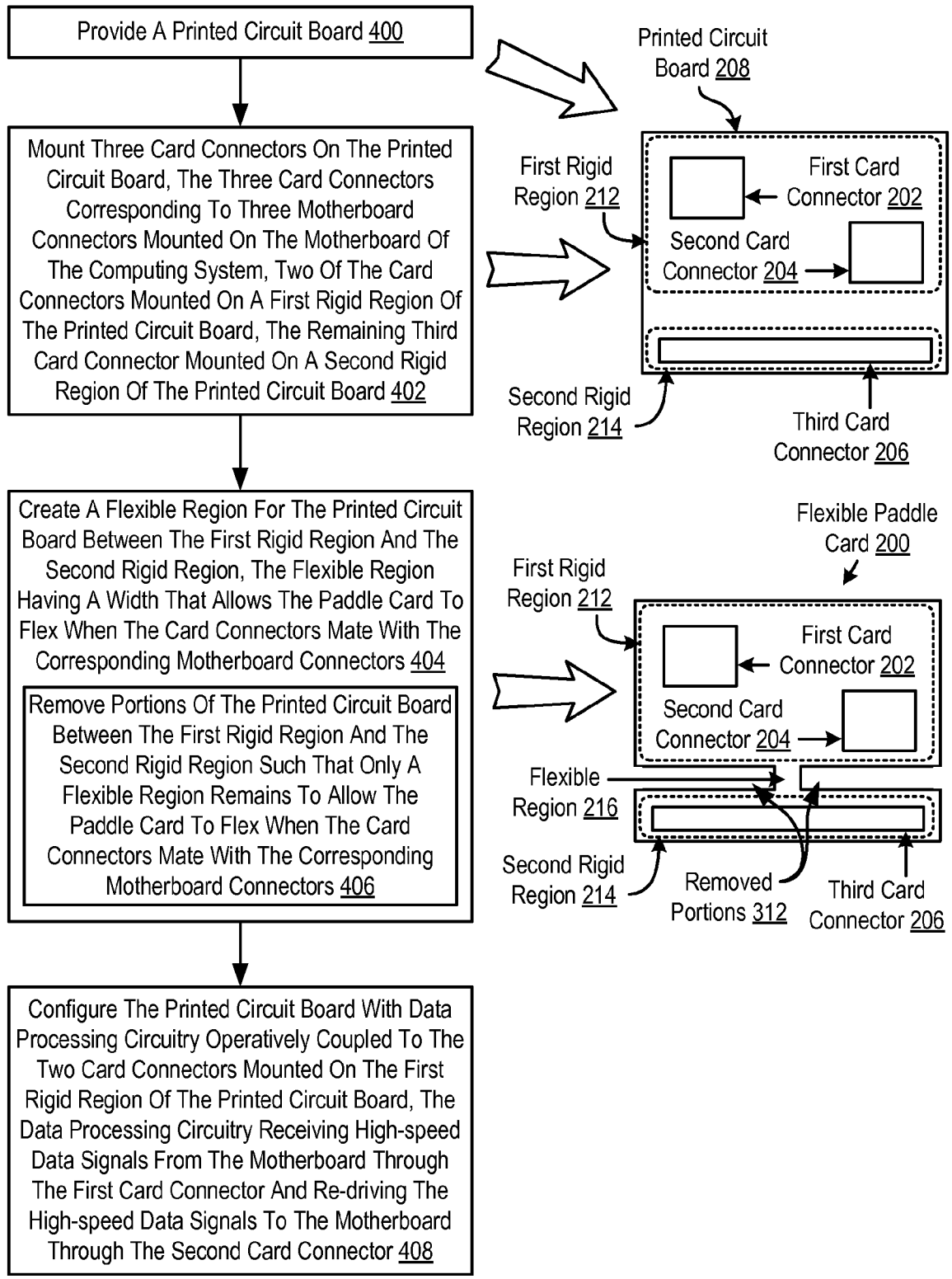
FIG. 4 sets forth a flow chart illustrating an exemplary method of manufacturing a flexible paddle card for installation on a motherboard of a computing system according to embodiments of the present invention.

The method of FIG. 4 also includes mounting (402) three card connectors (202, 204, 206) on the printed circuit board (208). The three card connectors (202, 204, 206) correspond to three motherboard connectors mounted on the motherboard of the computing system. Two (202, 204) of the card connectors are mounted on a first rigid region (212) of the printed circuit board (208). Each of the two card connectors (202, 204) mounted on the first rigid region (212) of the printed circuit board (208) includes high-speed differential data signal pins. The remaining third card connector (206) mounted on a second rigid region (214) of the printed circuit board (208). The remaining third card connector (206) mounted on the second rigid region (214) of the printed circuit board (208) includes control signal pins and power signal pins The method of FIG. 4 includes creating (404) a flexible region (216) for the printed circuit board (208) between the first rigid region (212) and the second rigid region (214), the flexible region (216) having a width that allows the paddle card (200) to flex when the card connectors (202, 204, 206) mate with the corresponding motherboard connectors. Creating (404) a flexible region (216) for the printed circuit board (208) between the first rigid region (212) and the second rigid region (214) according to the method of FIG. 4 includes removing (406) portions (312) of the printed circuit board (208) between the first rigid region (212) and the second rigid region (214) such that only a flexible region (216) remains to allow the paddle card (200) to flex when the card connectors (202, 204, 206) mate with the corresponding motherboard connectors.

The method of FIG. 4 includes configuring (408) the printed circuit board (208) with data processing circuitry operatively coupled to the two card connectors (202, 204) mounted on the first rigid region (212) of the printed circuit board (208). As mentioned above, the data processing circuitry receives high-speed data signals from the motherboard through the first card connector (202) and re-drives the high-speed data signals to the motherboard through the second card connector (204).

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A flexible paddle card for installation on a motherboard of a computing system, the flexible paddle card oriented parallel with the motherboard when installed in the computing system, the paddle card comprising:

a printed circuit board; and three card connectors that correspond to three motherboard connectors mounted on the motherboard, two of the card connectors mounted on a first rigid region of the printed circuit board, the remaining third card connector mounted on a second rigid region of the printed circuit board, and the first rigid region and the second rigid region separated by a flexible region of the printed circuit board, the flexible region having a width that allows the printed circuit board to flex when the card connectors mate with the motherboard connectors.

2. The flexible paddle card of claim 1 wherein each of the two card connectors mounted on the first rigid region of the printed circuit board further comprises high-speed differential data signal pins.

3. The flexible paddle card of claim 1 wherein the remaining third card connector mounted on the second rigid region of the printed circuit board further comprises control signal pins and power signal pins.

4. The flexible paddle card of claim 1 wherein the remaining third card connector mounted on the second rigid region of the printed circuit board further comprises data signal pins.

5. The flexible paddle card of claim 1 further comprising data processing circuitry operatively coupled to the two card connectors mounted on the first rigid region of the printed circuit board, the data processing circuitry receiving high-speed data signals from the motherboard through the first card connector and re-driving the high-speed data signals to the motherboard through the second card connector.

6. A flexible paddle card having three card connectors that correspond to three motherboard connectors of a motherboard of a computing system, the flexible paddle card flexing to prevent damage to the flexible paddle card and to the motherboard when the card connectors mate with the corresponding motherboard connectors, the flexible paddle card comprising:

a printed circuit board; and three card connectors for mating with three corresponding motherboard connectors mounted on a motherboard wherein: two of the card connectors are mounted on a first rigid region of the printed circuit board; the remaining third card connector is mounted on a second rigid region of the printed circuit board;

and the printed circuit board comprises a flexible region that separates the first rigid region and the second rigid region, the flexible region having a width that allows the printed circuit board to flex when the card connectors mate with the motherboard connectors.

7. The flexible paddle card of claim 6 further comprising data processing circuitry operatively coupled to the two card connectors mounted on the first rigid region of the printed circuit board, the data processing circuitry receiving high-speed data signals from the motherboard through the first card connector and re-driving the high-speed data signals to the motherboard through the second card connector.

8. The flexible paddle card of claim 6 wherein each of the two card connectors mounted on the first rigid region of the printed circuit board further comprises high-speed differential data signal pins.

9. The flexible paddle card of claim 6 wherein the remaining third card connector mounted on the second rigid region of the printed circuit board further comprises control signal pins and power signal pins.

10. A method of enhancing an existing paddle card to prevent damage when the paddle card is installed on a motherboard of a computing system, the method comprising:

providing a paddle card, the paddle card including a printed circuit board, three card connectors mounted on the printed circuit board that correspond to three motherboard connectors mounted on the motherboard of the computing system;

identifying a first rigid region for the printed circuit board on which two of the card connectors are mounted;

identifying a second rigid region for the printed circuit board on which the remaining third card connector is mounted; and creating a flexible region for the printed circuit board between the first rigid region and the second rigid region, the flexible region having a width that allows the paddle card to flex when the card connectors mate with the corresponding motherboard connectors.

11. The method of claim 10 wherein creating a flexible region for the printed circuit board between the first rigid region and the second rigid region further comprises removing portions of the printed circuit board between the first rigid region and the second rigid region such that only a flexible region remains to allow the paddle card to flex when the card connectors mate with the corresponding motherboard connectors.

12. The method of claim 10 wherein the paddle card further comprises data processing circuitry operatively coupled to the two card connectors mounted on the first rigid region of the printed circuit board, the data processing circuitry receiving high-speed data signals from the motherboard through the first card connector and re-driving the high-speed data signals to the motherboard through the second card connector.

13. The method of claim 10 wherein each of the two card connectors mounted on the first rigid region of the printed circuit board further comprises high-speed differential data signal pins.

14. The method of claim 10 wherein the remaining third card connector mounted on the second rigid region of the printed circuit board further comprises control signal pins and power signal pins.

15. A method of manufacturing a flexible paddle card for installation on a motherboard of a computing system, the flexible paddle card oriented parallel with the motherboard when installed in the computing system, the method comprising:

providing a printed circuit board;

mounting three card connectors on the printed circuit board, the three card connectors corresponding to three motherboard connectors mounted on the motherboard of the computing system, two of the card connectors mounted on a first rigid region of the printed circuit board, the remaining third card connector mounted on a second rigid region of the printed circuit board; and creating a flexible region for the printed circuit board between the first rigid region and the second rigid region, the flexible region having a width that allows the paddle card to flex when the card connectors mate with the corresponding motherboard connectors.

16. The method of claim 15 wherein creating a flexible region for the printed circuit board between the first rigid region and the second rigid region further comprises removing portions of the printed circuit board between the first rigid region and the second rigid region such that only a flexible region remains to allow the paddle card to flex when the card connectors mate with the corresponding motherboard connectors.

17. The method of claim 15 further comprising configuring the printed circuit board with data processing circuitry operatively coupled to the two card connectors mounted on the first rigid region of the printed circuit board, the data processing circuitry receiving high-speed data signals from the motherboard through the first card connector and re-driving the high-speed data signals to the motherboard through the second card connector.

18. The method of claim 15 wherein each of the two card connectors mounted on the first rigid region of the printed circuit board further comprises high-speed differential data signal pins.

19. The method of claim 15 wherein the remaining third card connector mounted on the second rigid region of the printed circuit board further comprises control signal pins and power signal pins.

* * * * *